United States Patent
Shimonishi et al.

(10) Patent No.: US 10,978,619 B2
(45) Date of Patent: Apr. 13, 2021

(54) LIGHT EMITTING DEVICE

(71) Applicant: TOYODA GOSEI CO., LTD., Kiyosu (JP)

(72) Inventors: Shota Shimonishi, Kiyosu (JP); Tomohiro Miwa, Kiyosu (JP); Satomi Seki, Kiyosu (JP); Daisuke Kato, Kiyosu (JP); Shigeo Takeda, Kiyosu (JP); Shota Yamamori, Kiyosu (JP); Yukihiro Demukai, Kiyosu (JP); Ikuhiro Oya, Kiyosu (JP)

(73) Assignee: TOYODA GOSEI CO., LTD., Kiyosu (JP)

(*) Notice: Subject to any disclaimer, the term of this patent is extended or adjusted under 35 U.S.C. 154(b) by 0 days.

(21) Appl. No.: 15/827,412

(22) Filed: Nov. 30, 2017

(65) Prior Publication Data

US 2018/0158994 A1    Jun. 7, 2018

(30) Foreign Application Priority Data

Dec. 2, 2016 (JP) ............... JP2016-234940
Apr. 14, 2017 (JP) ............... JP2017-080904

(51) Int. Cl.
*H01L 33/50* (2010.01)
*H01L 33/56* (2010.01)
(Continued)

(52) U.S. Cl.
CPC ........ *H01L 33/502* (2013.01); *C09K 11/7774* (2013.01); *H01L 33/504* (2013.01);
(Continued)

(58) Field of Classification Search
CPC ....... H01L 33/502; H01L 33/60; H01L 33/56; H01L 33/54; H01L 33/504; C09K 11/7774
See application file for complete search history.

(56) References Cited

U.S. PATENT DOCUMENTS

| 2004/0155225 A1* | 8/2004 | Yamada ............... C04B 35/597 |
| | | 252/301.4 R |
| 2009/0121615 A1* | 5/2009 | Le Toquin ......... C09K 11/7734 |
| | | 313/503 |

(Continued)

FOREIGN PATENT DOCUMENTS

| JP | 2011-176276 A | 9/2011 |
| JP | 2013-243129 A | 12/2013 |

(Continued)

OTHER PUBLICATIONS

Color rendering index. Wikipedia. URL: https://en.wikipedia.org/wiki/Color_rendering_index. Retrieved on Sep. 4, 2018.*

(Continued)

*Primary Examiner* — Hoang-Quan Ho
(74) *Attorney, Agent, or Firm* — McGinn I.P. Law Group, PLLC.

(57) ABSTRACT

A light emitting device includes a light emitting element that emits a light having a peak emission wavelength in a wavelength range of not less than 410 nm and not more than 425 nm, and a phosphor emitting a fluorescence having a peak at a longer wavelength side than the peak emission wavelength of light emitted from the light emitting element. A general color rendering index Ra of fluorescence emitted from the phosphor is not less than 95. A general color rendering index Ra of mixed light of light emitted from the light emitting element and fluorescence emitted from the phosphor is higher than a general color rendering index Ra of fluorescence emitted from the phosphor. A color rendering index Rf of the mixed light is not less than 96.

20 Claims, 8 Drawing Sheets

(51) Int. Cl.
*H01L 33/54* (2010.01)
*H01L 33/60* (2010.01)
*C09K 11/77* (2006.01)

(52) U.S. Cl.
CPC .............. *H01L 33/54* (2013.01); *H01L 33/56* (2013.01); *H01L 33/60* (2013.01)

(56) References Cited

U.S. PATENT DOCUMENTS

| | | | |
|---|---|---|---|
| 2009/0231832 A1* | 9/2009 | Zukauskas | H01L 33/504 362/84 |
| 2009/0261710 A1* | 10/2009 | Zukauskas | H01L 33/504 313/503 |
| 2012/0112626 A1 | 5/2012 | Sakuta et al. | |
| 2013/0022758 A1* | 1/2013 | Trottier | C09K 11/7774 427/565 |
| 2013/0313516 A1 | 11/2013 | David et al. | |
| 2014/0097452 A1* | 4/2014 | Tomohiro | H01L 33/56 257/88 |
| 2015/0062892 A1* | 3/2015 | Krames | H05B 37/0281 362/231 |
| 2016/0273717 A1* | 9/2016 | Krames | G02B 6/0073 |
| 2017/0176647 A1* | 6/2017 | Nomiyama | C09K 11/0883 |
| 2017/0179347 A1* | 6/2017 | Asai | C09K 11/617 |
| 2017/0361124 A1* | 12/2017 | Parker | A61N 5/0613 |
| 2017/0368210 A1* | 12/2017 | David | A61L 2/0052 |
| 2018/0010749 A1 | 1/2018 | Shirakawa et al. | |
| 2018/0108817 A1* | 4/2018 | Chang | H01L 25/13 |
| 2018/0132329 A1* | 5/2018 | Yan | H01L 25/0753 |
| 2018/0135813 A1 | 5/2018 | Yamakawa et al. | |
| 2018/0219140 A1* | 8/2018 | Seki | H01L 33/504 |

FOREIGN PATENT DOCUMENTS

| | | |
|---|---|---|
| JP | 2016-111190 A | 6/2016 |
| JP | 2016-157965 A | 9/2016 |
| WO | WO 2016/152913 A1 | 9/2016 |
| WO | WO 2016/208684 A1 | 12/2016 |

OTHER PUBLICATIONS

US Department of Energy. Solid-State Lighting Technology Fact Sheet—Evaluating Color Rendition Using IES TM-30-15. URL: https://www.energy.gov/eere/ssl/tm-30-frequently-asked-questions Retrieved on Sep. 4, 2018.*

Royer and Houser et. al. Understanding and Applying TM-30-15. DOE+IES Webinar. Sep. 15, 2015. URL: https://www.energy.gov/eere/ssl/tm-30-frequently-asked-questions Retrieved on Sep. 4, 2018.*

Japanese Office Action, dated Aug. 4, 2020, in Japanese Application No. 2017-080904 and English Translation thereof.

* cited by examiner

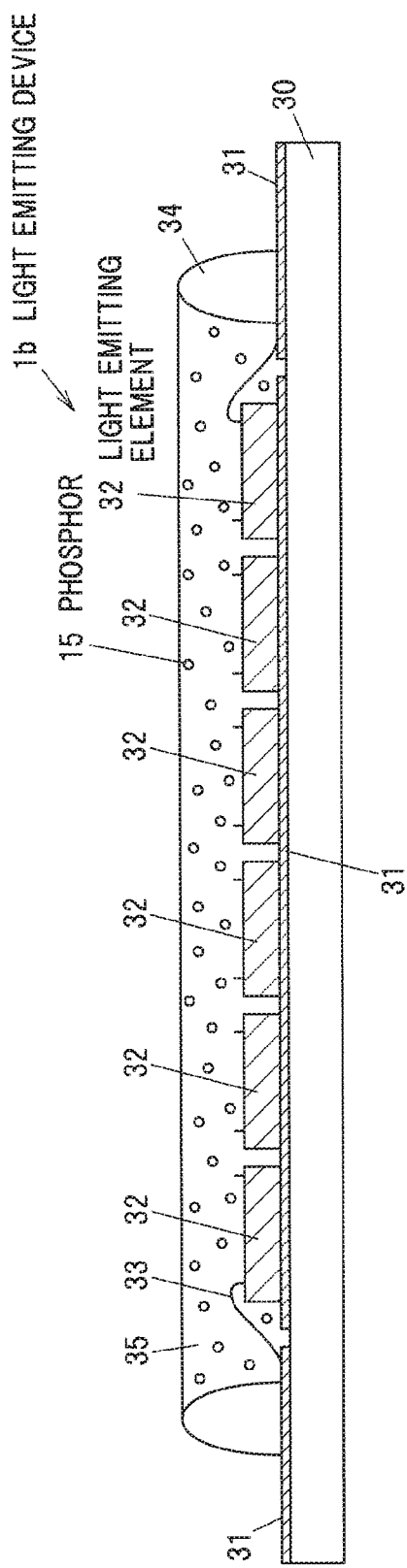

LIGHT EMITTING DEVICE

The present application is based on Japanese patent application Nos. 2016-234940 and 2017-080904 filed on Dec. 2, 2016 and Apr. 14, 2017, respectively, the entire contents of which are incorporated herein by reference.

BACKGROUND OF THE INVENTION

1. Field of the Invention

This invention relates to a light emitting device.

2. Description of the Related Art

A light emitting device is known that is provided with a light emitting element having a peak emission wavelength ranging 400 nm to 460 nm and a phosphor, and that emits a mixed light of light emitted from the light emitting element and fluorescence emitted from the phosphor, wherein the emitted light is not less than 85 in general color rendering index Ra and not less than 50 in special color rendering index R9 (red) (see e.g. JP 2016/111190A).

Also, a light emitting device is known that is provided with a light emitting element having a peak emission wavelength ranging a near-ultraviolet to a blue region and a phosphor, wherein emitted light thereof is 90 to 97 in general color rendering index Ra (see e.g. JP 2016/157965A).

Meanwhile, the general color rendering index Ra and the special color rendering index R9 are parameters which are used in the color rendering property evaluation method (i.e., JIS Z 8726:1990) of a light source defined by Japan Industrial Standards (JIS) for evaluating by quantification the color rendering property thereof. It is assumed that according as the parameters of light come close to 100, the light comes close to a reference light such as the sunlight.

SUMMARY OF THE INVENTION

It is an object to provide a light emitting device that is excellent in color rendering property so as to emit a light closer to the sunlight than the light emitted from the known light emitting device.

According to an embodiment of the invention, a light emitting device defined by [1] to [5] below is provided.

[1] A light emitting device, comprising:
a light emitting element that emits a light having a peak emission wavelength in a wavelength range of not less than 410 nm and not more than 425 nm; and
a phosphor emitting a fluorescence having a peak at a longer wavelength side than the peak emission wavelength of light emitted from the light emitting element,
wherein a general color rendering index Ra of fluorescence emitted from the phosphor is not less than 95,
wherein a general color rendering index Ra of mixed light of light emitted from the light emitting element and fluorescence emitted from the phosphor is higher than a general color rendering index Ra of fluorescence emitted from the phosphor, and
wherein a color rendering index Rf of the mixed light is not less than 96.

[2] A light emitting device, comprising:
a light emitting element that emits a light having a peak emission wavelength in a wavelength range of not less than 414 nm and not more than 421 nm; and
a phosphor emitting a fluorescence having a peak at a longer wavelength side than the peak emission wavelength of light emitted from the light emitting element,
wherein a general color rendering index Ra of fluorescence emitted from the phosphor is not less than 95,
wherein a general color rendering index Ra of mixed light of light emitted from the light emitting element and fluorescence emitted from the phosphor is higher than a general color rendering index Ra of the fluorescence emitted from the phosphor, and
wherein the general color rendering index Ra of the mixed light and a color rendering index Rf of the mixed light are not less than 97.

[3] The light emitting device according to [1] or [2], wherein a color rendering index Rg of the mixed light is not less than 98 and not more than 102.

[4] The light emitting device according to any one of [1] to [3], wherein a special color rendering index R9 of the mixed light is not less than 90.

[5] The light emitting device according to any one of [1] to [4], wherein the phosphor comprises four different phosphors.

Effects of the Invention

According to an embodiment of the invention, a light emitting device can be provided that is excellent in color rendering property so as to emit a light closer to the sunlight than the light emitted from the known light emitting device.

BRIEF DESCRIPTION OF THE DRAWINGS

Next, the present invention will be explained in conjunction with appended drawings, wherein:

FIG. 7 is a vertical cross sectional view showing a FU-COB type light emitting device in Example 3;

DETAILED DESCRIPTION OF THE PREFERRED EMBODIMENTS

Embodiments (Structure of a Light Emitting Device)

Figure 1:
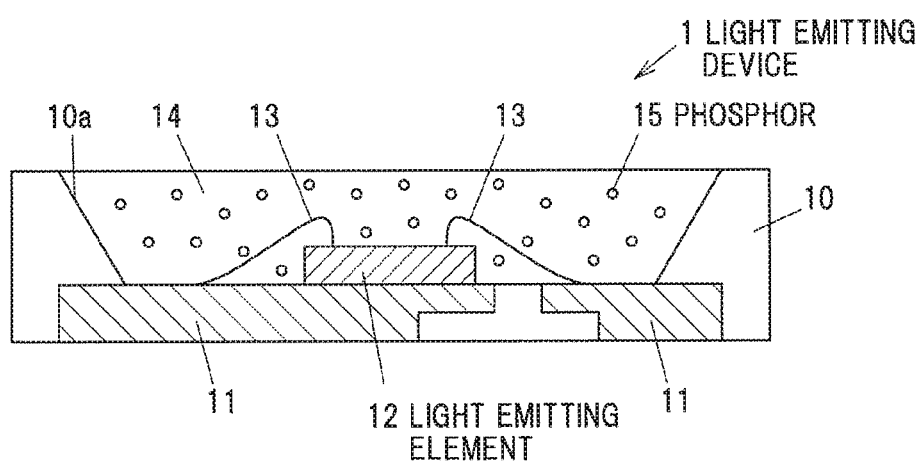
FIG. 1 is a vertical cross sectional view showing a light emitting device 1 according to the embodiment.

FIG. 1 is a vertical cross sectional view showing a light emitting device 1 according to the embodiment. The light emitting device 1 is provided with a case 10 having a recessed portion 10a, a lead frame 11 located in the case 10 so as to be exposed at a bottom of the recessed portion 10a, a light emitting element 12 mounted on the lead frame 11, bonding wire 13 electrically connecting the lead frame 11 and an electrode of the light emitting element 12, sealing resin 14 filled in the recessed portion 10a and sealing the light emitting element 12, and a particle phosphor 15 included in the sealing resin 14.

For example, the case 10 comprises heat plasticity resins such as polyphthalamide resin, a Liquid Crystal Polymer (LCP), and Polycyclohexylene Dimethylene Terephalate (PCT), and thermoset resins such as silicone resin, modified silicone resin, epoxy resin, and modified epoxy resin. The case 10 is formed by injection molding or transfer molding. The case 10 may comprise light reflective particle such as titanium dioxide so as to improve optical reflectance.

For example, the whole or surface of the lead frame 11 comprises conductive materials such as Ag, Cu, and Al.

Typically, the light emitting element 12 is a light emitting diode (LED) element or a laser diode element. In the example shown in FIG. 1, the light emitting element 12 is a face-up type element connected to the lead frame 11 by the bonding wire 13. Meanwhile, the light emitting element 12 may be a face-down type element. The light emitting element 12 may be connected to the lead frame using a connecting member such as a conductive bump except the bonding wire.

For example, the sealing resin 14 comprises resin material such as the silicone resin or the epoxy resin.

The phosphor 15 emits fluorescence by the light emitted from the light emitting element 12 as an excitation source. The phosphor 15 is desirably provided with various types of the phosphors so as to improve a color rendering property of the light emitted from the light emitting device 1.

For example, the phosphor 15 comprises $Sr_{10}(PO_4)_6Cl_2:Eu^{2+}$ having a peak emission wavelength of 454 nm, $Sr_{10}(PO_4)_6Cl_2:Eu^{2+}$ having the peak emission wavelength of 473 nm, $Si_{6-z}Al_zO_zN_{8-z}:Eu^{2+}$ having the peak emission wavelength of 544 nm, $Ca—Si_{12-(m+n)}Al_{m+n}O_nN_{16-n}$ having the peak emission wavelength of 594 nm, and $CaAlSi(O, N)_3:Eu^{2+}$ having the peak emission wavelength of 639 nm.

For example, the phosphors contained in the above phosphor 15 may be replaced by $Sr_{10}(PO_4)_6Cl_2:Eu^{2+}$ with $BaMgAl_{10}O_{17}:Eu^{2+}$ or $LaAl(Si_{6-z}Al_3)N_{10-z}O_z:Ce^{3+}$, $Si_{6-z}Al_zO_zN_{8-z}:Eu^{2+}$ or $Ca—Si_{12-(m+n)}Al_{m+n}O_nN_{16-n}$ with $(Ba, Sr, Ca)_2SiO_4:Eu^{2+}$, and $CaAlSi(O, N)_3:Eu^{2+}$ with $(Ca, Sr)AlSiN_3:Eu^{2+}$ respectively.

Combinations of the phosphors contained in the phosphor 15 and deposition ratio of the phosphors are adjusted so as to satisfy the color rendering property of the light emitted from the light emitting device 1 into a base described below.

The phosphor 15 may be spread in the sealing resin 14 or settled in the bottom of the recessed portion 10a of the case 10.

Figure 2:
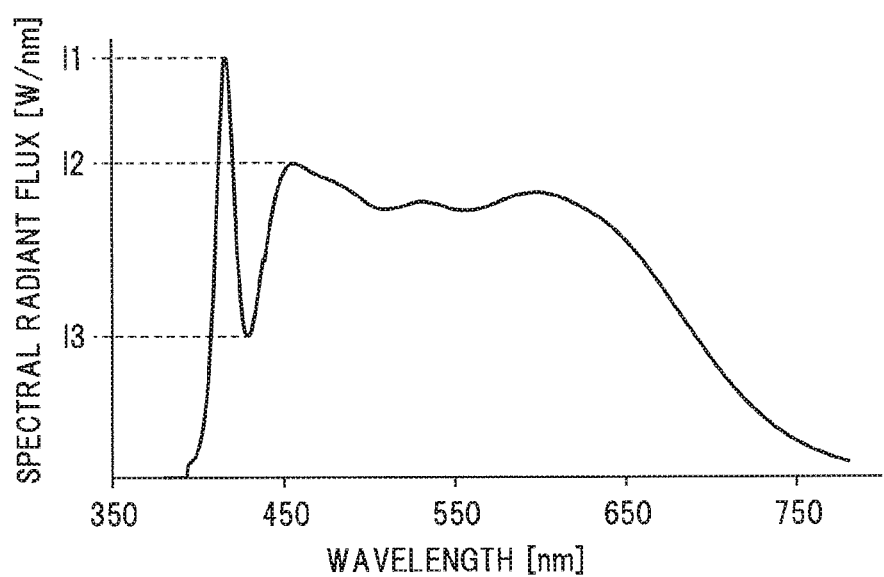
FIG. 2 is a graph showing an example of a spectrum of mixed light of light emitted from a light emitting element and fluorescence emitted from a phosphor.

FIG. 2 is a graph showing an example of a spectrum of mixed light of light emitted from the light emitting element 12 and the fluorescence emitted from the phosphor 15.

The peak of the spectrum at 416 nm shown in FIG. 2 is defined by the light emitted from a violet LED as the light emitting element 12. The other peak at a longer wavelength side from the peak of the spectrum at 416 nm is defined by the fluorescence emitted from the four-type phosphors contained in the phosphor 15.

In this case, as shown in FIG. 2, a spectral radiant flux at the peak emission wavelength of the light emitted from the light emitting element 12, a spectral radiant flux at the shortest peak emission wavelength in the fluorescence emitted from the phosphor 15, and a spectral radiant flux at a trough defined between the peak emission wavelength of the light emitted from the light emitting element 12 and the shortest peak emission wavelength in the fluorescence emitted from the phosphor 15 are respectively defined as I1, I2, and I3.

As I1/I3, the ratio of I1 to I3, and I2/I3, the ratio of I2 to I3 are small, the trough defined between the peak emission wavelength of the light emitted from the light emitting element 12 and the shortest peak emission wavelength in the fluorescence emitted from the phosphor 15 becomes shallow in the spectrum of the mixed light of the light emitted from the light emitting element 12 and the fluorescence emitted from the phosphor 15. Thus, the spectrum of the mixed light comes close to the spectrum of the sunlight.

One embodiment of the light emitting device 1 according to the present embodiment is provided with the light emitting element 12 emitting the light having the peak emission wavelength ranging 405 nm to 425 nm, and the phosphor 15 emitting the fluorescence having the peak at the longer wavelength side from the peak emission wavelength of the light emitted from the light emitting element 12. The one embodiment satisfies $1.55 \leq I1/I3 \leq 7.00$ and $1.20 \leq I2/I3 \leq 5.50$. In addition, the general color rendering index Ra of the mixed light of the light emitted from the light emitting element 12 and the fluorescence emitted from the phosphor 15 is not less than 96, where a light of color temperature of 5000 to 6500 K is defined as a reference light. The color temperature of 5000 to 6500 K is equivalent to the color temperature of the sunlight from the morning to about three o'clock in the afternoon.

Another embodiment of the light emitting device 1 according to the present embodiment is provided with the light emitting element 12 emitting the light having the peak emission wavelength ranging 410 nm to 425 nm, and the phosphor 15 emitting the fluorescence having the peak at the longer wavelength side from the peak emission wavelength of the light emitted from the light emitting element 12. The general color rendering index Ra of the fluorescence emitted from the phosphor 15 is not more than 95. The general color rendering index Ra of the mixed light of the light emitted from the light emitting element 12 and the fluorescence emitted from the phosphor 15 is higher than the general color rendering index Ra of the fluorescence emitted from the phosphor 15. In addition, the color rendering index Rf of the mixed light is not less than 96. Here, the general color rendering index Ra of the fluorescence emitted from the phosphor and the general color rendering index Ra and color rendering index Rf of the mixed light are indexes obtained when a light of color temperature of 5000 to 6500 K is defined as a reference light.

The other embodiment of the light emitting device 1 according to the present embodiment is provided with the light emitting element 12 emitting the light having the peak emission wavelength ranging 414 nm to 421 nm, and the phosphor 15 emitting the fluorescence having the peak at the longer wavelength side from the peak emission wavelength of the light emitted from the light emitting element 12. The general color rendering index Ra of the mixed light of the light emitted from the light emitting element 12 and the fluorescence emitted from the phosphor 15 is higher than the general color rendering index Ra of the fluorescence emitted from the phosphor 15. In addition, the color rendering index Rf of the mixed light is not less than 97. Here, the general color rendering index Ra of the fluorescence emitted from the phosphor and the general color rendering index Ra and color rendering index Rf of the mixed light are indexes obtained when a light of color temperature of 5000 to 6500 K is defined as a reference light.

The color rendering index Rg of the mixed light of the light emitted from the abovementioned light emitting element 12 and the fluorescence emitted from the phosphor 15 is desirably not less than 98 and not more than 102. A special color rendering index R9 of the mixed light of the light emitted from the abovementioned light emitting element 12 and the fluorescence emitted from the phosphor 15 is desirably not less than 90.

The above color rendering indexes Rf and Rg are defined by the color rendering indexes used in a new light color rendering property evaluation method "TM-30-15" defined by the Illuminating Engineering Society of North America (IES).

The Rf is a parameter showing color fidelity. The Rf can evaluate the color fidelity in higher accuracy than the general color rendering index Ra since the Rf can be obtained by 99 types of color tests. The maximum of the Rf is defined as 100. It means that the color of the test light comes close to the color of the reference light such as the sunlight if the Rf is close to 100.

The Rg is a parameter showing the color brightness that is not evaluated in the known evaluation method. It is assumed that according as the Rg comes close to 100, the color brightness of the test light is close to the color brightness of the reference light such as the sunlight. The Rg may be less than 100 or more than 100.

Meanwhile, the structure of the light emitting device 1 is not limited to the structure shown in FIG. 1 described above as long as the light emitting device 1 is provided with the light emitting element 12 and the phosphor 15.

(Effects of the Embodiments)

According to the above embodiments, the light emitting device can be provided that is excellent in color rendering property so as to emit a light close to the sunlight, wherein the emitted light is high in general color rendering index Ra, special color rendering index R9 and color rendering indexes Rf and Rg etc.

Example 1

Results of a simulation for obtaining the construction of the light emitting device 1 having excellent color rendering property will be described below.

In the simulation, used as the phosphor 15 are $Sr_{10}(PO_4)_6Cl_2:Eu^{2+}$ having a peak emission wavelength of 454 nm, $Sr_{10}(PO_4)_6Cl_2:Eu^{2+}$ having a peak emission wavelength of 473 nm, $Si_{6-z}Al_zO_zN_{8-z}:Eu^{2+}$ having a peak emission wavelength of 544 nm, $Ca—Si_{12-(m+n)}Al_{m+n}O_nN_{16-n}$ having a peak emission wavelength of 594 nm, and $CaAlSi(O, N)_3:Eu^{2+}$ having a peak emission wavelength of 639 nm.

The wavelength of the light emitted from the light emitting element 12, that is, the excitation wavelength of the phosphor 15 is varied from 385 nm to 430 nm. Thereby, the general color rendering index Ra, the special color rendering index R9, and the color rendering indexes Rf and Rg with respect to the excitation wavelengths are calculated from spectra of the mixed light (hereinafter simply called "mixed light" below) of the light emitted from the light emitting element 12 and the fluorescence emitted from the phosphor 15.

Figure 3A:
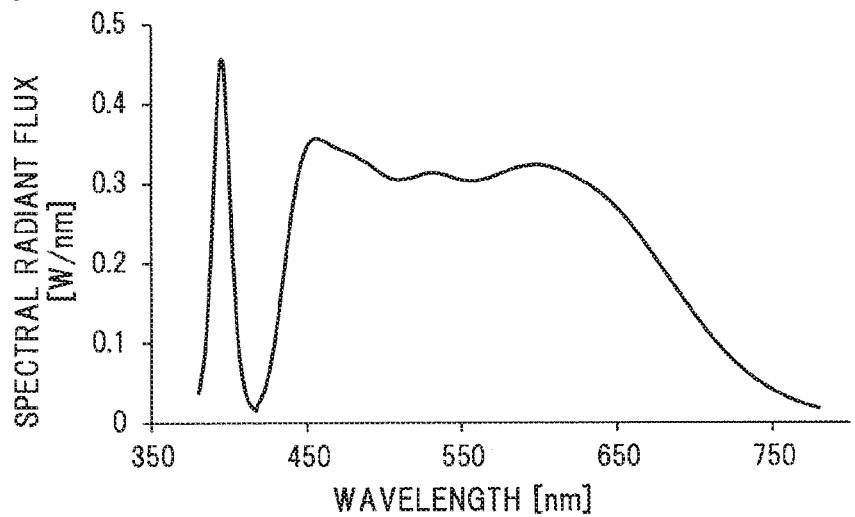
FIG. 3A is a graph showing the example of the spectrum of the mixed light of the light emitted from the light emitting element and the fluorescence emitted from the phosphor having an excitation wavelength of 395 nm.
Figure 3B:
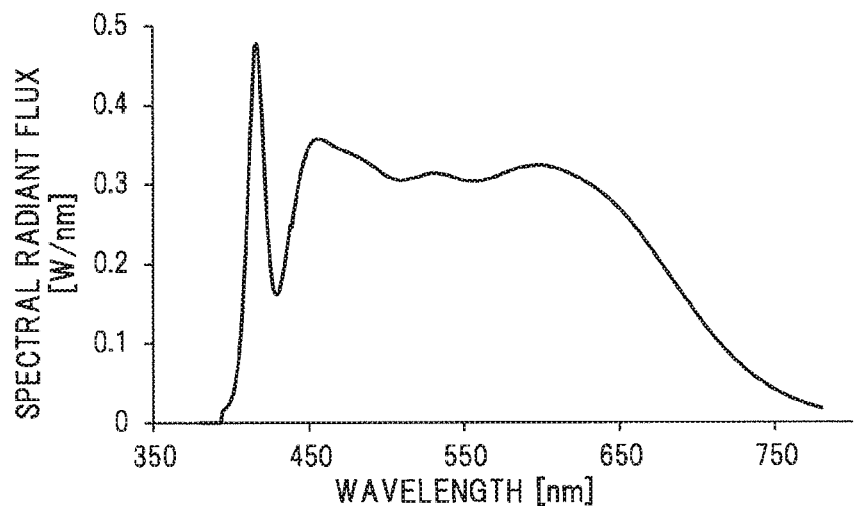
FIG. 3B is a graph showing the example of the spectrum of the mixed light of the light emitted from the light emitting element and the fluorescence emitted from the phosphor having the excitation wavelength of 416 nm.
Figure 3C:
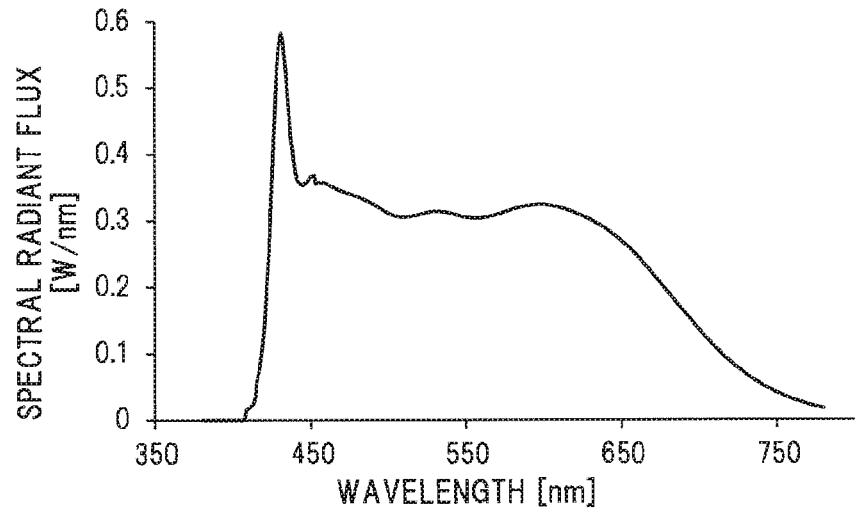
FIG. 3C is a graph showing the example of the spectrum of the mixed light of the light emitted from the light emitting element and the fluorescence emitted from the phosphor having the excitation wavelength of 430 nm.

FIG. 3A is a graph showing the example of the spectrum of the mixed light having the excitation wavelength of the phosphor 15 of 395 nm. FIG. 3B is a graph showing the example of the spectrum of the mixed light having the excitation wavelength of the phosphor 15 of 416 nm. FIG. 3C is a graph showing the example of the spectrum of the mixed light having the excitation wavelength of the phosphor 15 of 430 nm. FIGS. 3A to 3C show that the trough defined between the peak emission wavelength of the light emitted from the light emitting element 12 and the shortest peak emission wavelength in the fluorescence emitted from the phosphor 15 in the spectrum of the mixed light becomes shallow according as the wavelength of the light emitted from the light emitting element 12 comes close to the wavelength of the fluorescence emitted from the phosphor 15.

The spectral radiant flux ratios I1/I3, I2/I3 in the spectrum of the mixed light, the general color rendering index Ra of the mixed light, the special color rendering index R9 of the mixed light, and the color rendering indexes Rf and Rg of the mixed light calculated from the simulation will be shown in Tables 1 and 2 described below with respect to the excitation wavelengths.

In Tables 1 and 2, "excitation wavelength" means the wavelength of the light emitted from the light emitting element 12. Also, "only phosphor" means that the spectrum of the fluorescence emitted from the phosphor 15 is only applied to the simulation. Further, "CCT" means the Correlated Color Temperature.

TABLE 1

| Excitation Wavelength | Only Phosphor | 385 nm | 395 nm | 405 nm | 410 nm | 411 nm | 412 nm | 413 nm | 414 nm | 415 nm |
|---|---|---|---|---|---|---|---|---|---|---|
| CCT | 5206K | 5218K | 5231K | 5293K | 5359K | 5377K | 5397K | 5419K | 5443K | 5469K |
| I1/I3 | — | 23.57 | 30.17 | 6.93 | 4.69 | 4.29 | 3.92 | 3.59 | 3.31 | 3.05 |
| I2/I3 | — | 18.44 | 23.60 | 5.42 | 3.67 | 3.35 | 3.06 | 2.81 | 2.59 | 2.39 |
| Ra | 95 | 95 | 95 | 96 | 96 | 96 | 96 | 96 | 97 | 97 |
| R9 | 86 | 86 | 87 | 89 | 91 | 91 | 92 | 92 | 93 | 94 |
| Rf | 90 | 91 | 91 | 94 | 96 | 97 | 97 | 97 | 97 | 97 |
| Rg | 97 | 97 | 97 | 98 | 99 | 99 | 99 | 100 | 100 | 100 |

TABLE 2

| Excitation Wavelength | 416 nm | 417 nm | 418 nm | 419 nm | 420 nm | 421 nm | 422 nm | 423 nm | 425 nm | 430 nm |
|---|---|---|---|---|---|---|---|---|---|---|
| CCT | 5497K | 5528K | 5561K | 5596K | 5634K | 5674K | 5716K | 5759K | 5850K | 6082K |
| I1/I3 | 2.83 | 2.62 | 2.44 | 2.27 | 2.12 | 1.98 | 1.86 | 1.75 | 1.57 | 1.29 |
| I2/I3 | 2.21 | 2.05 | 1.91 | 1.78 | 1.66 | 1.55 | 1.46 | 1.37 | 1.23 | 1.01 |
| Ra | 97 | 97 | 97 | 97 | 97 | 97 | 96 | 96 | 96 | 94 |
| R9 | 94 | 95 | 96 | 97 | 97 | 97 | 97 | 96 | 94 | 89 |
| Rf | 97 | 97 | 97 | 97 | 97 | 97 | 96 | 96 | 96 | 95 |
| Rg | 101 | 101 | 101 | 101 | 102 | 102 | 102 | 102 | 103 | 104 |

Figure 4A:
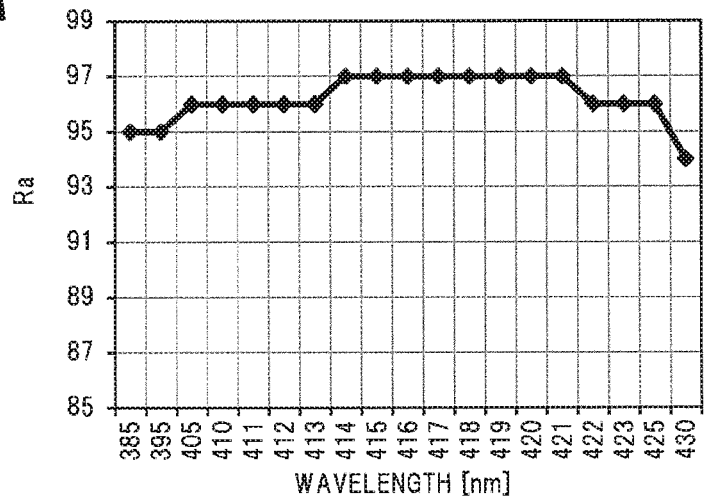
FIG. 4A is a graph that plots a general color rendering index Ra in Tables 1 and 2.

FIG. 4A is a graph that plots the general color rendering index Ra shown in Tables 1 and 2. The general color rendering index Ra of the mixed light is not less than 95 within the excitation wavelength range of 385 nm to 425 nm. The general color rendering index Ra of the mixed light is not less than 96 within the excitation wavelength range of 405 nm to 425 nm. The general color rendering index Ra of the mixed light is not less than 97 within the excitation wavelength range of 414 nm to 421 nm.

While the excitation wavelength ranges 405 nm to 425 nm, the general color rendering index Ra of the mixed light is higher than the general color rendering index Ra of the fluorescence emitted from the phosphor 15 since the general color rendering index Ra of only the fluorescence emitted from the phosphor 15 is 95.

Figure 4B:
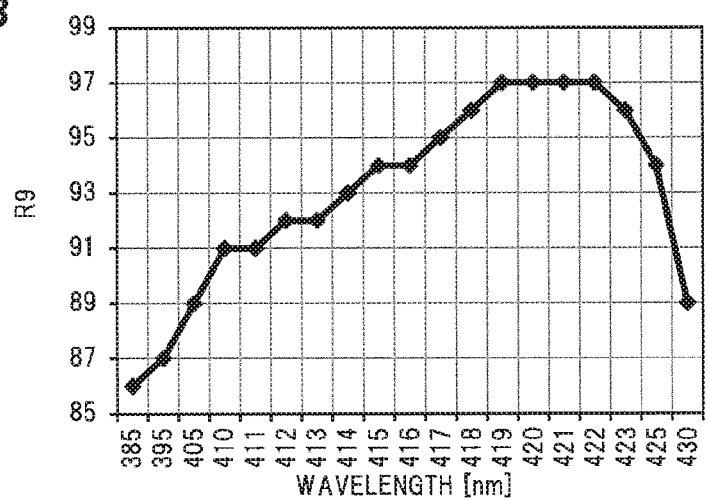
FIG. 4B is a graph that plots a special color rendering index R9 in Tables 1 and 2.

FIG. 4B is a graph that plots the special color rendering index R9 in Tables 1 and 2. The special color rendering index R9 of the mixed light is not less than 90 within the excitation wavelength range of 410 nm to 425 nm.

Figure 4C:
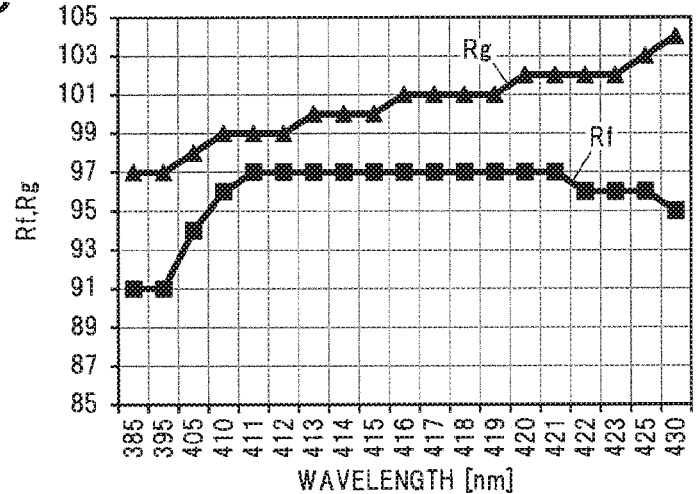
FIG. 4C is a graph that plots color rendering indexes Rf and Rg in Tables 1 and 2.

FIG. 4C is a graph that plots color rendering indexes Rf and Rg in Tables 1 and 2. The general color rendering index Rf of the mixed light is not less than 96 within the excitation wavelength range of 410 nm to 425 nm. The general color rendering index Rf of the mixed light is not less than 97 within the excitation wavelength range of 411 nm to 421 nm. Moreover, the general color rendering index Rg of the mixed light ranges 98 to 102 within the excitation wavelength range of 405 nm to 423 nm.

According to Tables 1 and 2, it is found that the general color rendering index Ra of the mixed light is not less than 96 where $1.55 \leq I1/I3 \leq 7.00$ and $1.20 \leq I2/I3 \leq 5.50$ are approximately satisfied.

Example 2

Example 2 exemplifying light emitting devices, which emit light excellent in color rendering property, manufactured based on the simulation results of Example 1 will be described below. In Example 2, the light emitting devices of six kinds of phosphors are each manufactured so as to measure emission spectra thereof to obtain the color temperature, the general color rendering index Ra, and the color rendering indexes Rf and Rg.

In Example 2, a surface-mount device type (SMD type) light emitting device 1 constructed as shown in FIG. 1 and a chip-on-board type (FC-COB type) light emitting device 1a with a flip-chip type light emitting element mounted thereon are each manufactured so as to measure the emission spectra thereof.

Figure 5:
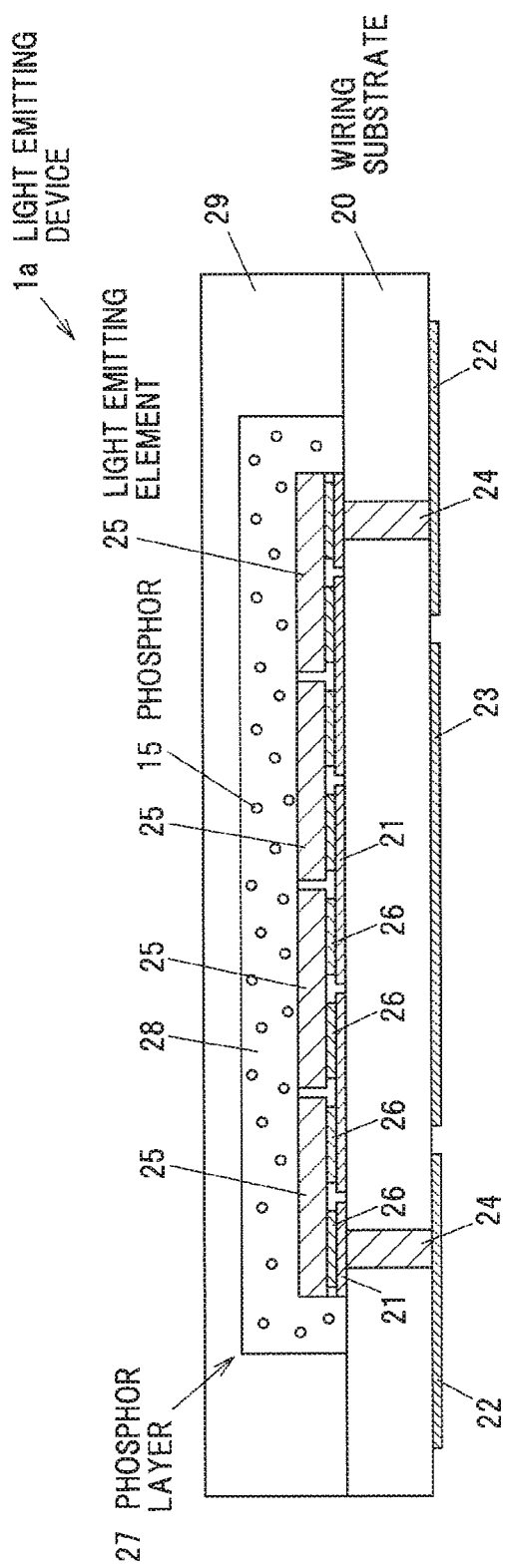
FIG. 5 is a vertical cross sectional view showing a FC-COB type light emitting device in Example 2.

FIG. 5 is a vertical cross sectional view showing the FC-COB type light emitting device 1a in Example 2. The light emitting device 1a is provided with a wiring substrate 20, plural light emitting elements 25 mounted on the surface of the wiring substrate 20, a phosphor layer 27 covering the surface of the light emitting elements 25, and a sealing member 29 covering the surface of the phosphor layer 27.

A wiring 21 is formed on the upper surface of the wiring substrate 20 and a conduction pattern 22 and a heat-dissipation pattern 23 are formed on the bottom surface of the wiring substrate 20. The wiring 21 and the conduction pattern 22 are electrically connected by a via-hole 24.

The light emitting element 25 has the same emission property as the light emitting element 12 of the light emitting device 1. Electrodes 26 of the light emitting element 25 are connected to the wiring 21 by a conductive paste (not shown).

The phosphor layer 27 is formed on the light emitting elements 25 by coating and is composed of a binder resin 28 and a phosphor 15 included in the binder resin 28.

In Example 2, used as the phosphor 15 included in the light emitting devices 1 and 1a are $(Ba, Sr)_{10}(PO_4)_6Cl_2:Eu^{2+}$ having a peak emission wavelength of 454 nm and FWHM (full width at half maximum) of 53 nm, $(Ba, Sr)_{10}(PO_4)_6Cl_2:Eu^{2+}$ having a peak emission wavelength of 473 nm and FWHM of 81 nm, $Si_{6-z}Al_zO_zN_{8-z}:Eu^{2+}$ having a peak emission wavelength of 544 nm and FWHM of 55 nm, $Ca-Si_{12-(m+n)}Al_{m+n}O_nN_{16-n}$ having a peak emission wavelength of 594 nm and FWHM of 84 nm, $CaAlSi(O, N)_3:Eu^{2+}$ having a peak emission wavelength of 639 nm FWHM of 125 nm, and $CaAlSiN_3:Eu^{2+}$ having a peak emission wavelength of 668 nm FWHM of 93 nm. The sealing resin 14 and the binder resin 28 are of a methyl-based silicone resin.

Table 3 below shows excitation wavelengths (i.e., emission wavelength of the light emitting element 12) of the phosphor 15 of the three kinds of SMD type light emitting devices 1 (Samples 1 to 3), the six kinds of phosphors composing the phosphor 15, and a mixing ratio (mass ratio) of a resin composing the sealing resin 14.

TABLE 3

| | | Sample | | |
|---|---|---|---|---|
| | | 1 | 2 | 3 |
| Excitation wavelength (peak value) (FWHM: 13.8 nm) | | 418.6 nm | 416.6 nm | 420.9 nm |
| Mixing ratio (mass %) | $(Ba,Sr)_{10}(PO_4)_6Cl_2:Eu^{2+}$ | 13.3 | 23.7 | 18.9 |
| | $(Ba,Sr)_{10}(PO_4)_6Cl_2:Eu^{2+}$ | 27.1 | 21.4 | 28.3 |
| | $Si_{6-z}Al_zO_zN_{8-z}:Eu^{2+}$ | 1.6 | 1.3 | 1.4 |
| | $Ca-Si_{12-(m+n)}Al_{m+n}O_nN_{16-n}$ | 1.4 | 1.2 | 1 |
| | $CaAlSi(O,N)_3:Eu^{2+}$ | 1 | 1.1 | 1 |
| | $CaAlSiN_3:Eu^{2+}$ | 0.4 | 0.4 | 0.4 |
| | Methyl-based silicone | 55.2 | 50.9 | 49 |

Figure 6A:
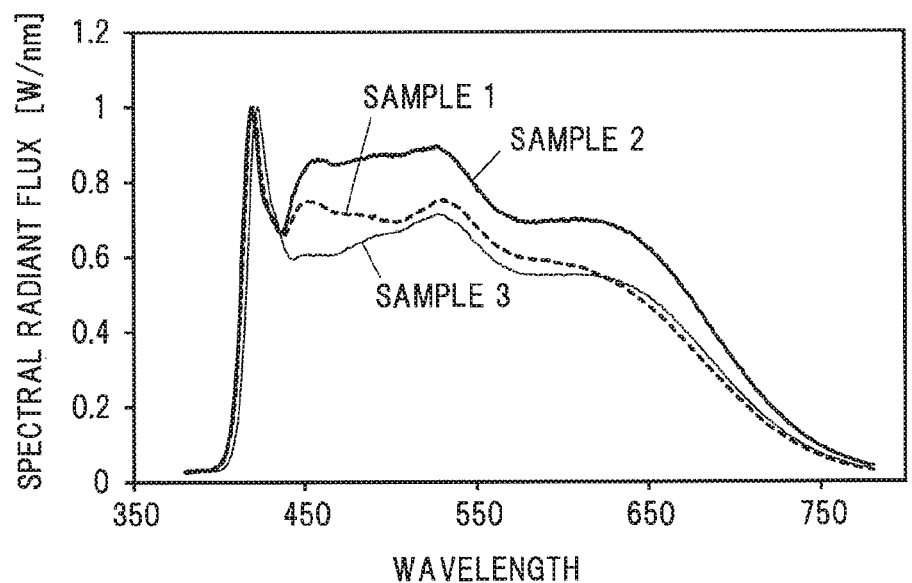
FIG. 6A shows emission spectra of three kinds of SMD type light emitting devices (Samples 1 to 3) in Example 2.

FIG. 6A shows emission spectra of the three kinds of SMD type light emitting devices 1 (Samples 1 to 3) in Example 2.

Table 4 below shows the emission efficiency, correlated color temperature (CCT) of the three SMD type light emitting devices 1 (Samples 1 to 3), and the spectral radiant flux ratios I1/I3 and I2/I3, general color rendering index Ra, and color rendering indexes Rf and Rg obtained from the emission spectra in FIG. 6A.

TABLE 4

|  | Sample | | |
| --- | --- | --- | --- |
|  | 1 | 2 | 3 |
| Emission efficiency | 112 lm/W | 107 lm/W | 112 lm/W |
| CCT | 6817 | 6403 | 6419 |
| CCT (target value) | 6500 | 6500 | 6500 |
| I1/I3 | 1.517 | 1.503 | 1.682 |
| I2/I3 | 1.135 | 1.295 | 1.025 |
| Ra | 97 | 99 | 96 |
| Rf | 97 | 98 | 96 |
| Rg | 100 | 100 | 101 |

Table 5 below shows excitation wavelengths (i.e., emission wavelength of the light emitting element 25) of the phosphor 15 of the three kinds of FC-COB type light emitting devices 1a (Samples 4 to 6), the six phosphors composing the phosphor 15, and a mixing ratio (mass ratio) of a resin composing the binder resin 28. Also, Table 5 shows a simulation-calculated thickness (i.e., a thickness of a part on the light emitting elements 25 of the phosphor layer 27) of the phosphor layer 27.

TABLE 5

|  |  | Sample | | |
| --- | --- | --- | --- | --- |
|  |  | 4 | 5 | 6 |
| Excitation wavelength (peak value) (FWHM: 13.8 nm) | | 417.5 nm | 417.5 nm | 417.5 nm |
| Mixing ratio (mass %) | $(Ba,Sr)_{10}(PO_4)_6Cl_2:Eu^{2+}$ | 15.37 | 15.37 | 15.37 |
| | $(Ba,Sr)_{10}(PO_4)_6Cl_2:Eu^{2+}$ | 50.5 | 50.5 | 50.5 |
| | $Si_{6-z}Al_zO_zN_{8-z}:Eu^{2+}$ | 3.59 | 3.59 | 3.59 |
| | $Ca-Si_{12-(m+n)}Al_{m+n}O_nN_{16-n}$ | 1.23 | 1.23 | 1.23 |
| | $CaAlSi(O,N)_3:Eu^{2+}$ | 5.63 | 5.63 | 5.63 |
| | $CaAlSiN_3:Eu^{2+}$ | 0.72 | 0.72 | 0.72 |
| | Methyl-based silicone | 22.96 | 22.96 | 22.96 |
| Thickness of phosphor layer | | 120 | 110 | 125 |

Figure 6B:
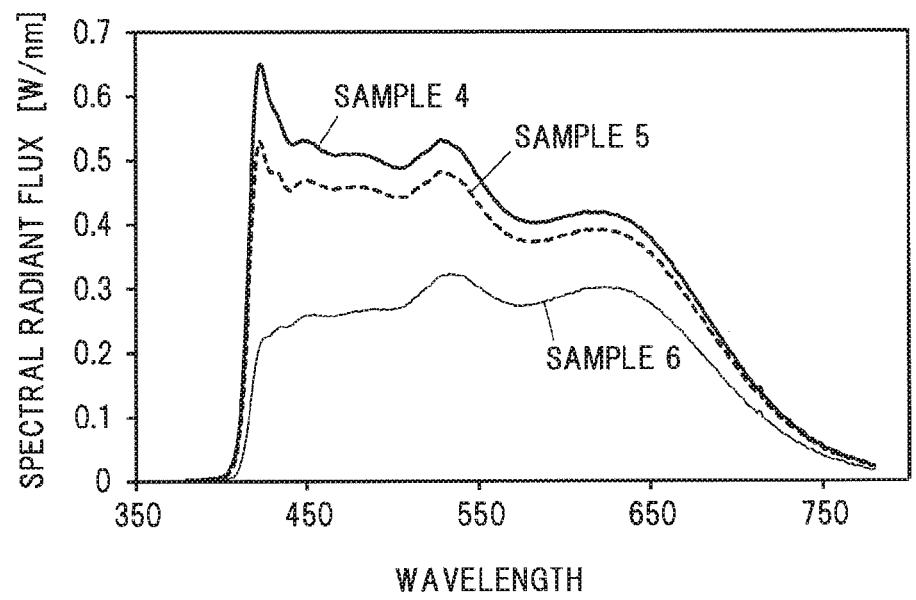
FIG. 6B shows emission spectra of the three FC-COB type light emitting devices (Samples 4 to 6) in Example 2.

FIG. 6B shows emission spectra of the three FC-COB type light emitting devices 1a (Samples 4 to 6) in Example 2.

Table 6 below shows the correlated color temperature (CCT) of the FC-COB type light emitting devices 1a (Samples 4 to 6), and the spectral radiant flux ratios I1/I3 and I2/I3, general color rendering index Ra, and color rendering indexes Rf and Rg obtained from the emission spectra in FIG. 6B. However, the ratios I1/I3 and I2/I3 of Sample 6 cannot be obtained because the corresponding peaks are difficult to identify.

TABLE 6

|  | Sample | | |
| --- | --- | --- | --- |
|  | 4 | 5 | 6 |
| CCT | 5510 | 6446 | 5085 |
| CCT (target value) | 5500 | 6500 | 5000 |
| I1/I3 | 1.239 | 1.169 | — |

TABLE 6-continued

|  | Sample | | |
| --- | --- | --- | --- |
|  | 4 | 5 | 6 |
| I2/I3 | 1.012 | 1.037 | — |
| Ra | 97 | 99 | 96 |
| Rf | 97 | 98 | 96 |
| Rg | 100 | 100 | 101 |

As a result, it is found that the light emitting devices 1 and 1a emitting a light excellent in color rendering property can be obtained by using the six kinds of phosphors where the excitation wavelength of the phosphor is set to be not less than 405 nm and not more than 425 nm.

Although all of Samples 1 to 6 in Example 2 does not satisfy the conditions of 1.55≤I1/I3≤7.00 and 1.20≤I2/I3≤5.50 obtained by the simulation results in Example 1, they have high Ra, Rf and Rg values. It is assumed that this is caused by a difference between the target value of CCT and the real values thereof etc. Thus, the results of Example 2 teach that the high Ra, Rf and Rg values can be obtained even if the conditions of 1.55≤I1/I3≤7.00 and 1.20≤I2/I3≤5.50 are not satisfied.

Example 3

Example 3 exemplifying light emitting devices, which emit light excellent in color rendering property, manufactured based on the simulation results of Example 1 will be described below. In Example 3, the light emitting devices of four kinds of phosphors are each manufactured so as to measure emission spectra thereof to obtain the color temperature, the general color rendering index Ra, and the color rendering indexes Rf and Rg.

In Example 3, a surface-mount device type (SMD type) light emitting device 1 constructed as shown in FIG. 1 and a face-up chip-on-board type (FU-COB type) light emitting device 1b with a face-up type light emitting element mounted thereon are each manufactured so as to measure the emission spectra thereof.

FIG. 7 is a vertical cross sectional view showing the FU-COB type light emitting device 1b in Example 3. The light emitting device 1b is provided with a substrate 30, plural light emitting elements 32 mounted on the surface of the substrate 30 and electrically connected to electrodes 31 by bonding wires 33, a ring-shaped dam formed surrounding the mount region of the plural light emitting elements 32, a sealing resin 35 sealing the plural light emitting elements 32, and particulate phosphors 15 included in the sealing resin 35.

In Example 3, used as the phosphor 15 included in the light emitting devices 1 and 1b are $(Ba, Sr)_{10}(PO_4)_6Cl_2:Eu^{2+}$ having a peak emission wavelength of 455 nm and FWHM (full width at half maximum) of 59 nm, $(Ba, Sr)_{10}(PO_4)_6Cl_2:Eu^{2+}$ having a peak emission wavelength of 482 nm and FWHM of 83 nm, $(Ba, Sr)_2SiO_4:Eu^{2+}$ having a peak emission wavelength of 549 nm and FWHM of 87 nm, and $CaAlSi(O, N)_3:Eu^{2+}$ having a peak emission wavelength of 644 nm FWHM of 122 nm. The sealing resins 14 and 35 are of a methyl-based silicone resin.

Table 7 below shows excitation wavelengths (i.e., emission wavelength of the light emitting element 12) of the phosphor 15 of the two kinds of SMD type light emitting devices 1 (Samples 7 and 8), the four kinds of phosphors composing the phosphor 15, and a mixing ratio (mass ratio) of a resin composing the sealing resin 14.

TABLE 7

|  |  | Sample | |
|---|---|---|---|
|  |  | 7 | 8 |
| Excitation wavelength (peak value) (FWHM: 13.8 nm) | | 416.5 nm | 416.5 nm |
| Mixing ratio (mass %) | $(Ba,Sr)_{10}(PO_4)_6Cl_2:Eu^{2+}$ | 23.33 | 27.79 |
| | $(Ba,Sr)_{10}(PO_4)_6Cl_2:Eu^{2+}$ | 11.07 | 14.96 |
| | $(Ba,Sr)_2SiO_4:Eu^{2+}$ | 2.8 | 2.5 |
| | $CaAlSi(O,N)_3:Eu^{2+}$ | 4.19 | 4.75 |
| | Methyl-based silicone | 58.61 | 50 |

Figure 8A:
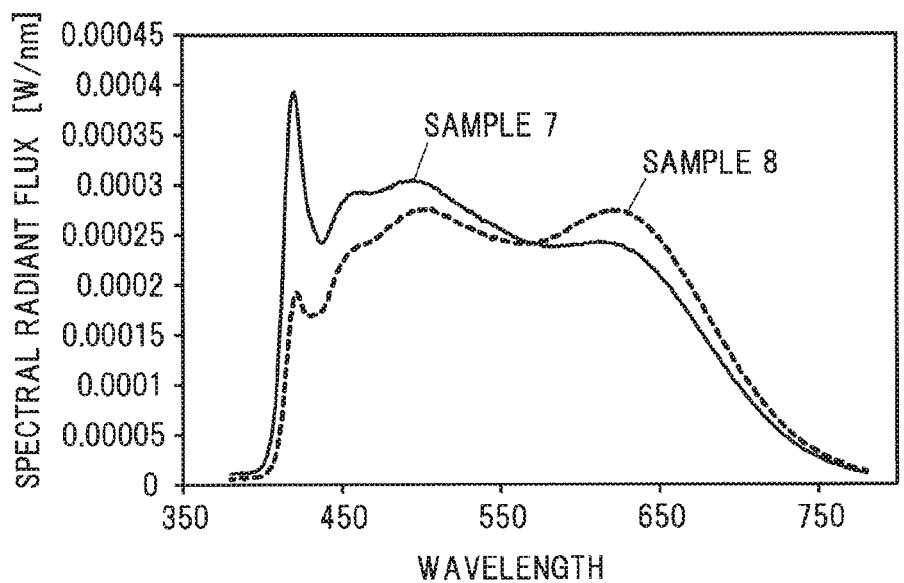
FIG. 8A shows emission spectra of two kinds of SMD type light emitting devices (Samples 7 and 8) in Example 3.

FIG. 8A shows emission spectra of the two kinds of SMD type light emitting devices 1 (Samples 7 and 8) in Example 3.

Table 8 below shows the emission efficiency, correlated color temperature (CCT) of the two SMD type light emitting devices 1 (Samples 7 and 8), and the spectral radiant flux ratios I1/I3 and I2/I3, general color rendering index Ra, and color rendering indexes Rf and Rg obtained from the emission spectra in FIG. 8A.

TABLE 8

|  | Sample | |
|---|---|---|
|  | 7 | 8 |
| CCT | 6484 | 5025 |
| CCT (target value) | 6500 | 5000 |
| I1/I3 | 1.625 | 1.136 |
| I2/I3 | 1.210 | 1.421 |
| Ra | 97 | 96 |
| Rf | 97 | 95 |
| Rg | 101 | 100 |

Table 9 below shows excitation wavelengths (i.e., emission wavelength of the light emitting element 32) of the phosphor 15 of the three kinds of FU-COB type light emitting devices 1b (Samples 9 to 11), the four phosphors composing the phosphor 15, and a mixing ratio (mass ratio) of a resin composing the sealing resin 35.

TABLE 9

|  |  | Sample | | |
|---|---|---|---|---|
|  |  | 9 | 10 | 11 |
| Excitation wavelength (peak value) (FWHM: 13.8 nm) | | 417.5 nm | 417.5 nm | 417.5 nm |
| Mixing ratio (mass %) | $(Ba,Sr)_{10}(PO_4)_6Cl_2:Eu^{2+}$ | 8.99 | 11.02 | 22.24 |
| | $(Ba,Sr)_{10}(PO_4)_6Cl_2:Eu^{2+}$ | 17.98 | 22.04 | 12 |
| | $(Ba,Sr)_2SiO_4:Eu^{2+}$ | 1.4 | 1.33 | 2 |
| | $CaAlSi(O,N)_3:Eu^{2+}$ | 2.64 | 3.61 | 3.76 |
| | Methyl-based silicone | 69 | 62 | 60 |

Figure 8B:
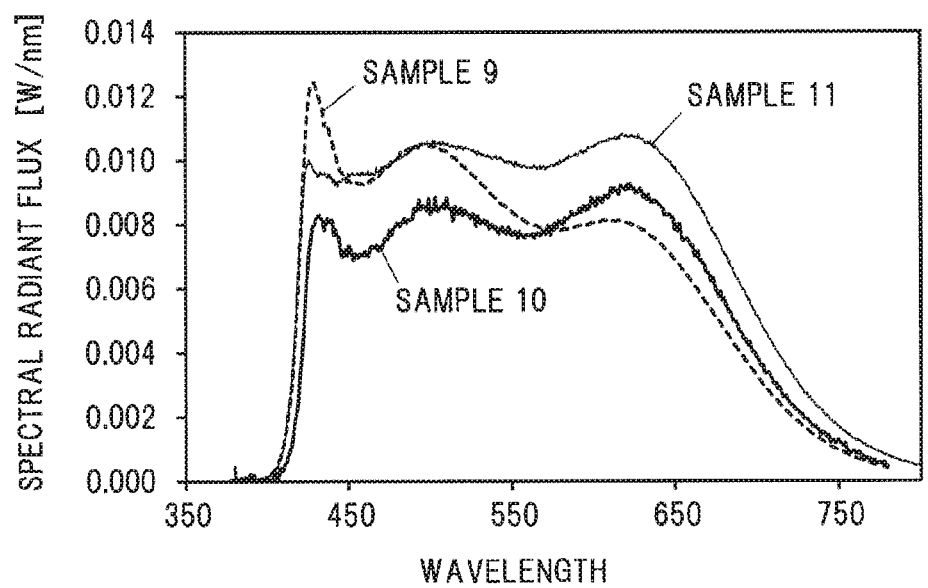
FIG. 8B shows emission spectra of the three FU-COB type light emitting devices (Samples 9 to 11) in Example 3.

FIG. 8B shows emission spectra of the three FU-COB type light emitting devices 1b (Samples 9 to 11) in Example 3.

Table 10 below shows the correlated color temperature (CCT) of the FU-COB type light emitting devices 1b (Samples 9 to 11), and the spectral radiant flux ratios I1/I3 and I2/I3, general color rendering index Ra, and color rendering indexes Rf and Rg obtained from the emission spectra in FIG. 8B.

TABLE 10

|  | Sample | | |
|---|---|---|---|
|  | 9 | 10 | 11 |
| CCT | 6735 | 4951 | 5206 |
| CCT (target value) | 6500 | 5000 | 5000 |
| I1/I3 | 1.345 | 1.204 | 1.081 |
| I2/I3 | 1.137 | 1.283 | 1.539 |
| Ra | 96 | 95 | 96 |
| Rf | 96 | 96 | 97 |
| Rg | 102 | 102 | 102 |

As a result, it is found that the light emitting devices 1 and 1b emitting a light excellent in color rendering property can be obtained by using the four kinds of phosphors where the excitation wavelength of the phosphor is set to be not less than 405 nm and not more than 425 nm.

Although all of Samples 8 to 11 in Example 3 does not satisfy the conditions of 1.55≤I1/I3≤7.00 and 1.20≤I2/I3≤5.50 obtained by the simulation results in Example 1, they have high Ra, Rf and Rg values. Thus, the results of Example 3 also teach that the high Ra, Rf and Rg values can be obtained even if the conditions of 1.55≤I1/I3≤7.00 and 1.20≤I2/I3≤5.50 are not satisfied.

Although the embodiments have been described, the invention is not intended to be limited to the embodiments. The various kinds of modifications can be implemented without departing from the gist of the invention.

Also, the claimed invention is not intended to be limited to the embodiments. Further, it should be noted that all combinations of the features described in the embodiments and the examples are not necessary to solve the problems of the invention.

What is claimed is:

1. A light emitting device, comprising:
   a light emitting element that emits a light having a peak emission wavelength in a wavelength range of not less than 410 nm and not more than 425 nm; and
   a phosphor emitting a fluorescence having a peak at a longer wavelength side than the peak emission wavelength of light emitted from the light emitting element,
   wherein a general color rendering index Ra of fluorescence emitted from the phosphor is not less than 95,
   wherein a general color rendering index Ra of mixed light of light emitted from the light emitting element and fluorescence emitted from the phosphor is higher than the general color rendering index Ra of fluorescence emitted from the phosphor,
   wherein a color rendering index Rf of the mixed light is not less than 96,
   wherein the phosphor comprises a mixture of at least five kinds of phosphors,
   wherein each of the at least five kinds of phosphors has a peak emission wavelength that is within a range from 454 nm to 668 nm,
   wherein at least two of the at least five kinds of phosphors have peak emission wavelengths that are within a range from 454 mu to 473 nm, and
   wherein, in the phosphor, a mass ratio of a sum of the at least two of at least five kinds of phosphors is more than a mass ratio of a sum of remaining phosphors of the at least five kinds of phosphors.

2. A light emitting device, comprising:
   a light emitting element that emits a light having a peak emission wavelength in a wavelength range of not less than 414 nm and not more than 421 nm; and a phosphor emitting a fluorescence having a peak at a longer wavelength side than the peak emission wavelength of light emitted from the light emitting element, wherein a general color rendering index Ra of fluorescence emitted from the phosphor is not less than 95, wherein a general color rendering index Ra of mixed light of light emitted from the light emitting element and fluorescence emitted from the phosphor is higher than the general color rendering index Ra of the fluorescence emitted from the phosphor, wherein the general color rendering index Ra of the mixed light and a color rendering index Rf of the mixed light are not less than 97, wherein the phosphor comprises a mixture of at least five kinds of phosphors, wherein each of the at least five kinds of phosphors has a peak emission wavelength that is within a range from 454 nm to 668 nm, wherein at least two of the at least five kinds of phosphors have peak emission wavelengths that are within a range from 454 nm to 473 nm, and wherein, in the phosphor, a mass ratio of a sum of the at least two of the at least five kinds of phosphors is more than a mass ratio of a sum of remaining phosphors of the at least five kinds of phosphors.

3. The light emitting device according to claim 1, wherein a color rendering index Rg of the mixed light is not less than 98 and not more than 102.

4. The light emitting device according to claim 1, wherein a special color rendering index R9 of the mixed light is not less than 90.

5. The light emitting device according to claim 2, wherein a color rendering index Ieg of the mixed light is not less than 98 and not more than 102.

6. The light emitting device according to claim 2, wherein a special color rendering index R9 of the mixed light is not less than 90.

7. The light emitting device according to claim 3, wherein a special color rendering index R9 of the mixed light is not less than 90.

8. A light emitting device, comprising:
a light emitting element that emits a light having a peak emission wavelength in a wavelength range of not less than 405 nm and not more than 425 nm; and
a phosphor emitting a fluorescence having a peak at a longer wavelength side than the peak emission wavelength of light emitted from the light emitting element,
wherein $1.55 \leq I1 \leq 1.00$ and $1.20 \leq I2/I3 \leq 5.50$ are satisfied, where in a spectrum of mixed light of light emitted from the light emitting element and fluorescence emitted from the phosphor, I1 is defined as a spectral radiant flux at the peak emission wavelength of light emitted from the light emitting element, I2 is defined as a spectral radiant flux at a shortest peak emission wavelength in fluorescence emitted from the phosphor, and I3 is defined as a spectral radiant flux at a trough defined between the peak emission wavelength of light emitted from the light emitting element and the shortest peak emission wavelength in fluorescence emitted from the phosphor,
wherein a general color rendering index Ra of the mixed light is not less than 96,
wherein the phosphor comprises a mixture of at least five kinds of phosphors,
wherein each of the at least five kinds of phosphors has a peak emission wavelength that is within a range from 454 mu to 668 nm,
wherein at least two of the at least five kinds of phosphors have peak emission wavelengths that are within a range from 454 nm to 473 nm, and
wherein, in the phosphor, a mass ratio of a sum of the at least two of the at least five kinds of phosphors is more than a mass ratio of a sum of remaining phosphors of the at least five kinds of phosphors.

9. The light emitting device according to claim 8, wherein a general color rendering index Ra of fluorescence emitted from the phosphor is not less than 95.

10. The light emitting device according to claim 8, wherein a color rendering index Rg of the mixed light is not less than 98 and not more than 102.

11. The light emitting device according to claim 8, wherein a special color rendering index R9 of the mixed light is not less than 90.

12. The light emitting device according to claim 1, wherein the at least five kinds of phosphors comprise a mixture of five or six kinds of phosphors.

13. The light emitting device according to claim 1, wherein the at least five kinds of phosphors comprise a mixture of six kinds of phosphors.

14. The light emitting device according to claim 1, further comprising a sealing resin comprising a methyl-based silicone resin or an epoxy resin disposed on the light emitting element, the phosphor being dispersed in the sealing resin.

15. The light emitting device according to claim 1, wherein the light emitting device includes a plurality of light emitting elements including the light emitting element, and
wherein a sealing resin, in which the phosphor is dispersed, is disposed on side surfaces of the light emitting elements to space apart each of the light emitting elements from an adjacent light emitting element of the light emitting elements.

16. The light emitting device according to claim 1, wherein, in the phosphor, a mass percentage of each of the at least two of the at least five kinds of phosphors is more than a mass percentage of the sum of the remaining phosphors of the at least five kinds of phosphors.

17. The light emitting device according to claim 1, wherein, in the phosphor, a mass percentage of one of the at least two of the at least five kinds of phosphors is more than a mass percentage of the sum of the remaining phosphors of the at least five kinds of phosphors.

18. The light emitting device according to claim 1, wherein, in the phosphor, a mass percentage of one of the at least two of the at least five kinds of phosphors, which has the peak emission wavelength that is closer to 473 nm than 454 nm, is more than a mass percentage of another one of the at least two of the at least five kinds of phosphors, which has the peak emission wavelength that is closer to 454 nm than 473 nm.

19. The light emitting device according to claim 1, wherein one of the at least two of the at least five kinds of phosphors includes $(Ba, Sr)_{10}(PO_4)_6Cl_2:Eu^{2+}$.

20. The light emitting device according to claim 19, wherein another one of the at least two of the at least five kinds of phosphors includes $(Ba, Sr)_{10}(PO_4)_6Cl_2:Eu^{2+}$ having a full width at half maximum (FWHM) more than a FWHM of the $(Ba, Sr)_{10}(PO_4)_6Cl_2:Eu^{2+}$ of the one of the at least two of the at least five kinds of phosphors.

* * * * *